United States Patent [19]

Kutzavitch et al.

[11] Patent Number: 5,010,306

[45] Date of Patent: Apr. 23, 1991

[54] LOW COST DIGITAL AMPLITUDE REGULATOR

[75] Inventors: Walter G. Kutzavitch, Freehold; Eugene J. Rosenthal, Highland Park, both of N.J.

[73] Assignee: AT&T Bell Laboratories, Murray Hill, N.J.

[21] Appl. No.: 482,442

[22] Filed: Feb. 20, 1990

[51] Int. Cl.$^5$ .............................................. H03G 3/18
[52] U.S. Cl. .................................. 330/284; 307/350; 381/109
[58] Field of Search ...................... 307/234, 350, 362; 330/278, 279, 284, 302; 381/109, 108, 107

[56] References Cited

U.S. PATENT DOCUMENTS

| | | | |
|---|---|---|---|
| 4,468,631 | 8/1984 | Goldberg | 330/284 |
| 4,611,344 | 9/1986 | Hayana et al. | 381/109 X |
| 4,721,923 | 1/1988 | Bares et al. | 330/284 |
| 4,868,519 | 9/1989 | Shafer | 330/284 |
| 4,924,192 | 5/1990 | Sasaki | 330/284 X |

OTHER PUBLICATIONS

"Pulse, Digital, and Switching Waveforms", Millman & Taub, pp 230, 231.

*Primary Examiner*—Steven Mottola
*Attorney, Agent, or Firm*—Thomas Stafford

[57] ABSTRACT

Apparatus for digital amplitude regulation is disclosed, for use as a volume control or the like, utilizing pulse width modulation to control signal transmission through a two terminal non-linear element, the resistance of which varies with current, e.g., a diode or diode like element. A stream of pulses, the duty cycle of which is variable and digitally controlled, is filtered to produce a quasi-continuously variable reference signal. The value of the reference signal regulates gain by controlling the component of the signal of interest that is actually available for amplification. For low cost implementation in a system already employing a microprocessor or microcomputer the determinative duty cycle can be derived under software control and supplied as an output from a single latchable output pin. In an exemplary implementation, a derived DC component of the variable duty cycle pulses controls the DC output voltage from a voltage divider and is used to regulate the magnitude of a series of fixed magnitude pulses. Additionally, the use of an energy storing type filter allows the continuous stream of variable duty cycle pulses to be momentarily interrupted so that a pin used for supplying the pulses can be used for the performance of additional functions without affecting the perceived volume level.

15 Claims, 1 Drawing Sheet

LOW COST DIGITAL AMPLITUDE REGULATOR

CROSS-REFERENCE TO RELATED APPLICATION

U.S. patent application Ser. No. 07/482,443 was filed concurrently herewith.

TECHNICAL FIELD

This invention relates to digitally controlled variable gain amplifiers and, more particularly, to digital volume controls.

BACKGROUND OF THE INVENTION

Demand for higher functionality in today's consumer and busines electronics continues to require greater complexity from modern circuits. The further requirement that such products be available at lower cost requires the reuse or multiple function use of as many components as possible. Many microprocessor based products such as telephones, digitally tuned radios, games and facsimile machines produce and/or transmit signals, the amplitudes of which must be regulated. Typically, this regulation process is performed under direct customer control, i.e., volume controls and the like, although there are implementations in which the regulation is done automatically. Today, there is an increasing trend toward push button control because of the low cost of physically providing a button and the circuitry to sense the state of the button. However, the digitally controlled regulators that are responsive to the state of the button continue to add substantial cost. Prior digital controls generally required multiple dedicated pins of a microprocessor or dedicated pins of a latched output port to set volume levels. These control systems typically utilized some type of digital to analog (D/A) converter to which a binary number is supplied as an input and from which a representative voltage magnitude of a predetermined set of voltage magnitudes is derived. This derived voltage magnitude is used to determine the gain of a voltage controlled amplifier.

Alternatively, multiple controls for shunting or series incorporating elements, typically resistors, are used to set the gain of an amplification stage. In order to reduce cost, component count and thus the number of gain settings was limited, resulting in noticeable discontinuity between magnitude levels. These prior gain regulation system did, however, enjoy the advantage of simple and straight forward software development and implementation.

Another prior gain regulation system, disclosed in U.S. Pat. No. 4,868,519, uses microprocessor control to generate a variable duty cycle waveform that indirectly controls the drain to source resistance of an FET which is constantly monitored via a feedback loop, to regulate the gain of a two stage amplifier. Still other gain regulators, such as disclosed in U.S. Pat. No. 4,468,631, suggest the use of FETs or photo-resistors and photo-transistors for use in amplitude control apparatus. These systems are relatively expensive to implement because of their complexities. Additional cost is typically incurred by the introduction of non-essential elements that introduce indirectness of control and, most notably, in the use of feedback to monitor the actual value of the gain controlling factor or mechanism.

SUMMARY OF THE INVENTION

The prior difficulties with digital amplitude regulators, such as volume controls and the like, are avoided, in accordance with an aspect of the invention, by utilizing pulse width modulation to control the transmission of a signal through a two terminal non-linear element whose resistance varies with current, e.g., a diode or diode like element. A continuous stream of pulses, the duty cycle of which is variable and digitally controlled, is filtered to produce a quasi-continuously variable direct-current (DC) voltage. The DC voltage, either directly or by providing a DC current, regulates gain by controlling the component of the signal of interest that exceeds a predetermined threshold and therefor is actually available for amplification. For low cost implementation in a system already employing a microprocessor or microcomputer the determinative duty cycle can be derived under software control and supplied as an output from a single latchable output pin.

In an exemplary implementation, most suitable for regulating the amplitude of square waves, the DC voltage is generated in response to the variable duty cycle pulses by a single stage passive filter. This DC voltage is directly used to regulate the DC component of the output voltage from a voltage divider to which is input a series of fixed magnitude variable frequency pulses, the magnitude of which are to be regulated. The pulses, for example, are to be used as audible tones, e.g., for altering purposes in a telephone. A further filter, diode based in this example, permits only that part of the voltage divider output which is greater than a predetermined DC threshold to be passed to a fixed gain amplifier. The magnitude of the resulting amplified signal is thus regulated.

One advantage of this system is that because of the natural filtering action inherent in the basic operating principals of the system coupled with the large number of discrete duty cycles that even a reasonably highly loaded microprocessor can produce, the transistions between levels can easily be made to appear continuous to a user. Additionally, the use of an energy storing type filter allows, in accordance with another aspect of the invention, the stream of variable duty cycle pulses to be momentarily interrupted so that the pin used for supplying the pulses can be used for the performance of additional functions without affecting the perceived volume level. Thus, for example, the pin can also be used as an output that supplies pulses for scanning a key pad for button depressions. A further advantage of the invention is that it can be easily implemented in a system with only a single voltage supply.

BRIEF DESCRIPTION OF THE DRAWING

In the Drawing:
Shown in FIG. 1 is an example implementation of a digital amplitude regulator that is most suitable for regulating the amplitude of square waves.

DETAILED DESCRIPTION

Figure 1:
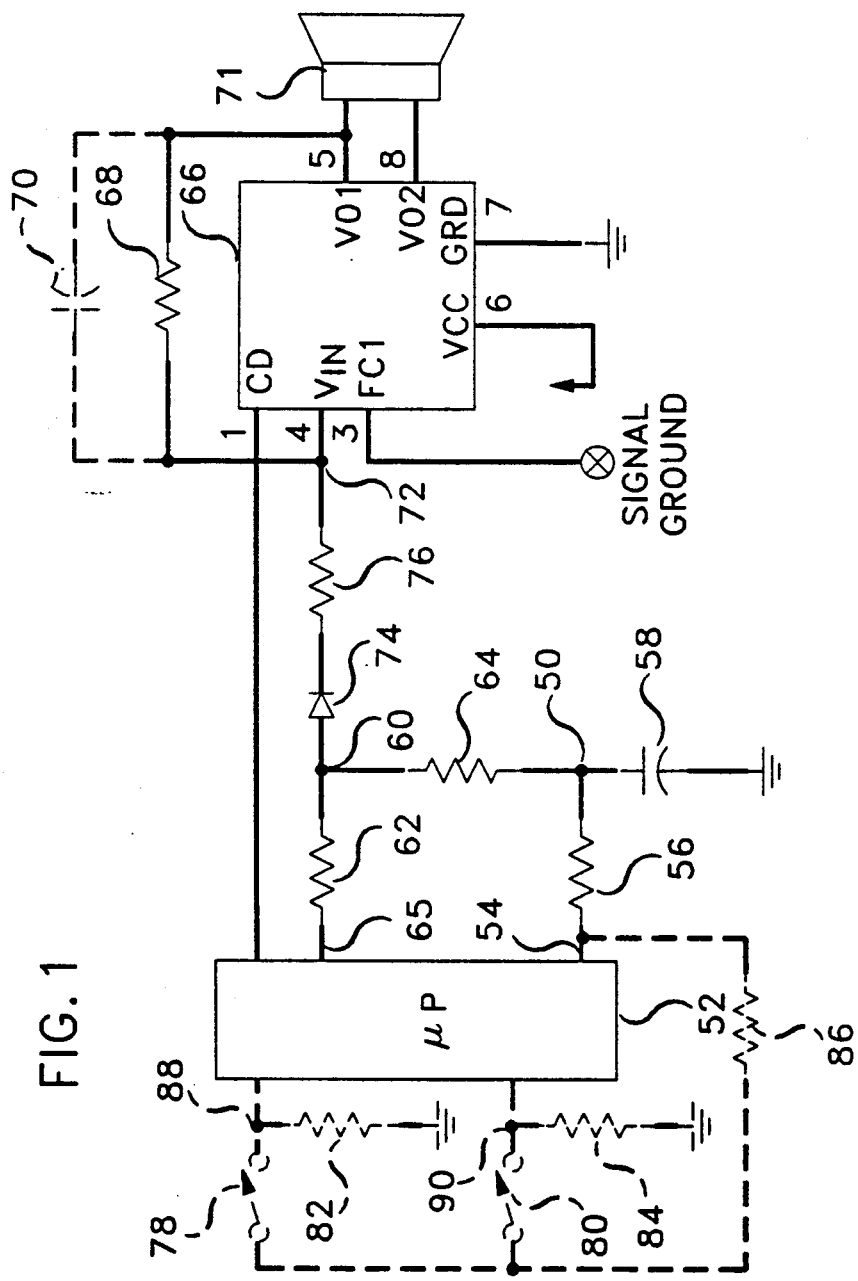

Shown in FIG. 1 is an example implementation wherein a DC reference voltage is generated at node 50 by filtering variable width pulses of a fixed frequency, i.e., variable duty cycle pulses, output by microcomputer 52. The pulses are supplied at pin 54, which is established as a latched output pin. Microcomputer 52, for example, is an 8-bit microcomputer such as MC68HC05C4 made by the Motorola Corporation.

Any known technique for generating and digitally controlling the duty cycle of the pulses may be used. For purposes of the present example, it is assumed that the software of microcomputer 12 is responsive to a keyboard or serial message system (not shown), to determine the actual duty cycle to be used at any particular moment. If the amplitudes of multiple signals are to be independently controlled by a single microprocessor each independent control will require its own latchable output pin and corresponding circuitry. This example implementation is most suitable for regulating the amplitude of square waves. The filtering is accomplished by a single stage passive filter comprising resistor 56 and capacitor 58. The magnitude of the voltage at node 50 is proportional to and varies directly with the duty cycle of the pulses. Changes in the duty cycle will be tracked by corresponding changes in the reference signal, i.e., voltage magnitude. Resistor 56 and capacitor 58 are selected so that the DC voltage maintained at node 50 is stable for any particular duty cycle, and yet, an undue amount of time, as perceived by a user, is not necessary to effect the required changes in the DC voltage. In this example, microcomputer 52 provides a pulse width modulated signal, at an amplitude of 5 volts peak-to peak the duty cycle of which may vary anywhere from 0% to 100%. Thus, the voltage at node 50 will vary from nearly 0 volts at a duty cycle of 0% to nearly 5 volts at a duty cycle of 100% with correspondingly proportionate voltages produced at corresponding duty cycles.

Node 60 is the intermediate node of a voltage divider comprising resistors 62 and 64. On one side the voltage divider is supplied with the voltage generated at node 50. The DC voltage generated at node 50 thus is directly used to regulate the DC component of the output voltage developed at node 60. On the other side, the voltage divider is supplied from pin 65 of microcomputer 52 with a series of fixed magnitude variable frequency pulses, the magnitude of which are to be regulated. Naturally, in other implementations, these signals may be generated by other independent circuitry. The fixed magnitude variable frequency pulses, for example, are to be used as audible tones, e.g., for alerting purposes in a telephone. A further filter, diode based in this example, permits only the instantaneous part of the sum of the AC and DC signal developed at node 60 which is greater than a predetermined DC threshold to be passed to fixed gain amplifier 66. In this example, a speaker driver amplifier chip is used as fixed gain amplifier 66.

The speaker driver includes an op-amp and functions as an op-amp with differential outputs. The speaker driver is responsive to an enable signal supplied to pin 1 which can be used to turn the speaker driver amplifier off under external control. The enable signal is supplied by microcomputer 52. Non-inverting terminal FC1 is connected to signal ground, a fixed predetermined DC voltage, the magnitude of which determines the maximum AC signal that is transmitted and amplified. For simplicity, the magnitude of signal ground should not be less than the minimum or more than the maximum voltage that can be directly supplied by the variable duty cycle pulses. If the magnitude of signal ground is less than the minimum or more than the maximum voltage that can be directly supplied by the variable duty cycle pulses some type of level shifting must be performed on the pulses. Level shifting is well known in the art.

The feedback loop for speaker driver 66 is completed by feedback resistor ($R_f$) 68 in parallel with optional roll off capacitor 70 between output VO1 and input Vin. Output VO1 is the normal op-amp output and VO2 is the inverse of VO1. The differential output between outputs VO1 and VO2 is supplied to speaker 71 for conversion of the electrical signal into audible sound waves. The value of feedback resistor 68 determines the overall gain in conjunction with the input resistance of the op-amp. Completing of the feedback loop causes a virtual signal ground to appear at the inverting input terminal of the op-amp, i.e., at node 72. Novel re-utilization of both components and signals allows a very low design to be implemented. The DC magnitude of the virtual signal ground serves as a reference voltage for a clipper circuit comprising diode 74 and resistor 76. Additionally, resistor 76 serves as the input resistance $R_i$ to the co-amp in the speaker drive. The clipper circuit is used as a DC threshold filter, i.e., an amplitude selector. Thus, only that part of the total signal at node 60 that is greater than the DC magnitude of the signal ground is transmitted to and amplified by the speaker driver.

The gain of speaker driver 66 as shown is computed like the gain of an co-amp in the inverting configuration the gain G varies inversely with input resistance, in accordance with the formula $G = -(R_f/R_i)$ wherein $R_f$ is a fixed, predetermined feedback resistor, and $R_i$ is the input resistance. Note that the feedback used for establishing the gain of an op-amp is not the same as the mentioned feedback used in prior systems to monitor the actual value of the gain controlling factor or mechanism. The minus sign in the gain formula indicates that the output of the op-amp is 180 degrees out of phase with the input.

In accordance with an aspect of the invention, by changing the duty cycle of the variable duty cycle pulses at node 54 the DC magnitude of the reference voltage at node 50 can be varied. The reference voltage in turn determines the DC component of voltage at node 60, regulating how much the original signal from pin 65 is amplified, i.e., controlling the resultant gain. The magnitude of the resulting amplified signal is thus regulated.

To generate tones with the system configuration shown in FIG. 1, a desired volume level is determined by microcomputer 52. Variable duty cycle pulses with a duty cycle corresponding to the desired volume level are output for a sufficient time to build up the required reference voltage at node 50. These pulses are continuously generated until a new volume level is chosen. Next, microcomputer 52 supplies a signal to enable speaker driver amplifier 66. A pattern of variable frequency pulses corresponding to the desired tone is supplied by microcomputer 52 at pin 65. Finally, microcomputer 52 supplies a signal to disable speaker driver amplifier 66. If desired, the amplitude of the variable frequency pulses may be dynamically varied by changing the duty cycle of the variable duty cycle pulses while the variable frequency pulses are being generated.

An advantage of the presented types of digital volume control systems is that because of the natural filtering action inherent in the basic operating principals of the system coupled with the large number of discrete duty cycles that even a reasonably highly loaded microprocessor can produce, the transitions between levels can easily by made to appear continuous to a user. Another advantage of the invention is that it can be easily implemented in a system with only a single voltage supply. Further, the use of an energy storing type filter allows, in accordance with another aspect of the invention, the stream of variable duty cycle pulses to be interrupted momentarily so that a pin supplying the variable duty cycle pulses can be used for another function without affecting the perceived volume level. Thus, for example, a microcomputer pin can also be used for supplying variable duty cycle pulses as well as an output for purposes of scanning a key pad for button depressions.

Also shown in FIG. 1 is an example optional minikeyboard for selecting volume up or volume down by a user. The keyboard and associated circuitry comprises push button switches 78 and 80, pull down resistors 82 and 84 and isolation resistor 86. Pins 88 and 90 of microcomputer 52 are configured as input ports. While keyboard scanning techniques are well known in the art, they must be combined with the generation of the variable duty cycle pulses. The keyboard only need be scanned at prescribed intervals and does not need the constant attention of microcomputer 52. When the signals from the keyboard are not being input by microcomputer 52, the signal being supplied to pin 54 is ignored by the keyboard scanning process. At an appropriate time to check the keyboard for switch closures, the value that is being provided to pin 54 as part of a variable duty cycle pulse is temporarily removed. Typically, this value is already stored in a register of microcomputer 52 from which it is copied and supplied to pin 54. Further, the value being output for the variable width pulses is generally determined by an interrupt routine initiated via the timeout of a timer and may actually change during the keyboard scanning operation. The keyboard scanning process in this simple example is initiated by writing a logic one to pin 54 and latching the logic levels appearing at pins 88 and 90. The appropriate value for the variable duty cycle pulses is then replaced at pin 54, by copying the value currently stored in the register, as if the keyboard scanning never took place. Considering switch 78 to signal volume up and switch 80 to signal volume down, a logic one appearing at pin 88 indicates that the user has closed switch 78 and is signaling volume up while a logic zero indicates switch 78 is open. Similarly, a logic one appearing at pin 90 indicates that the user has closed switch 80 and is signaling volume down while a logic zero indicates switch 80 is open. The keyboard is debounced over several cycles. If volume up is signaled, the duty cycle of the variable duty cycle pulses is increased by one unit. If volume down is signaled, the duty cycle of the variable duty cycle pulses is decreased by one unit. If both volume up and volume down are signaled simultaneously the button depressions are ignored and the current duty cycle is maintained. Before the duty cycle, and thus the volume, can be changed to another value either a predetermined time must elapse or both buttons must be found in the open state. It will be obvious, to one skilled in the art, that the multiplexed pin can can be used to scan the states of additional switches and that these additional switched need not be functionally related to the volume control mechanism.

We claim:

1. Apparatus for digitally regulating the magnitude of an output signal derived from an input signal comprising:
   means for generating a stream of pulses with a controllable variable duty cycle;
   means for controlling said duty cycle of said pulses;
   means for supplying said generated stream of variable duty cycle pulses;
   first means for filtering said supplied stream of variable duty cycle pulses to develop a DC voltage, the magnitude of said DC voltage being responsive to and proportional with the duty cycle of said stream of pulses;
   an input signal source for supplying said input signal;
   means for devloping a composite output signal containing components of said input signal and said DC voltage;
   a source of a predetermined threshold level;
   second means supplied with said composite output signal and being responsive to said predetermined threshold level for filtering any portion of said composite signal the magnitude of which is below said threshold level and for supplying as an output a filtered version of said composite signal; and
   amplifier means for amplifying said output of said second means to generate an output signal having a prescribed output magnitude.

2. The apparatus as defined in claim 1 wherein said means for generating said stream of pulses is digital.

3. The apparatus as defined in claim 1 wherein said second means comprises a clipper circuit.

4. The apparatus as defined in claim 1 wherein said second means comprises a series combination of a resistor having a first and second terminal and a diode having an anode and a cathode, the anode of said diode receiving said composite output signal, the cathode of said diode being connected to said first terminal of said resistor and said second terminal of said resistor being connected to said source of a predetermined thereshold level.

5. The apparatus as defined in claim 1 wherein said amplifier means is an operational amplifier type having at least first and second input terminals, said amplifier configured so as to have a virtual ground at said first input terminal to which is input said composite output signal wherein the DC magnitude at said virtual ground directly follows the value of said source of a predetermined threshold level and said DC magnitude of said virtual ground is applied to said second means for filtering.

6. The apparatus as defined in claim 1 wherein said means for developing is a voltage divider having first and second elements connected in prescribed circuit relationship.

7. The apparatus as defined in claim 6 wherein said composite output signal includes components of said input signal and said DC voltage proportional to the values of said first and second voltage divider elements.

8. The apparatus as defined in claim 1 further including means for receiving a signal indicating an increase in said output magnitude and means for receiving a signal indicating a decrease in said output magnitude and wherein said means for controlling said duty cycle of said pulses is responsive to said signals received by said means for receiving signals for increasing or decreasing said duty cycle in accordance with said signal to correspondingly adjust said output magnitude.

9. The apparatus as defined in claim 1 wherein said means for controlling said duty cycle includes means for varying said duty cycle between 0% and 100%.

10. The apparatus as defined in claim 1 wherein said input signal signal source is a microprocessor.

11. The apparatus as defined in claim 1 wherein said means for generating and said means for controlling comprise a microprocessor.

12. The apparatus as defined in claim 11 wherein said input signal source is said microprocessor.

13. The apparatus as defined in claim 1 further including means for multiplexing said means for supplying so that said means for supplying supplies other signals in addition to said generated stream of variable duty cycle pulses.

14. The apparatus as defined in claim 13 further including means for generating a periodic signal, means responsive to said periodic signal for producing a first output indicating increase said output magnitude, means responsive to said periodic signal for producing a second output indicating decrease said output magnitude, wherein said means for supplying further supplies on a multiplexed basis said periodic signal and said means for controlling is responsive to said first and second outputs to appropriately determine said duty cycle.

15. The apparatus as defined in claim 13 further including means for generating a periodic signal, one or more switch means for general purpose use, each of said switch means having at least one state, each of said switch means being responsive to said periodic signal so as to produce an output indicative of each of said switch states wherein said means for supplying further supplies said periodic signal.

* * * * *